United States Patent [19]

Hazen et al.

[11] Patent Number: 5,280,447
[45] Date of Patent: Jan. 18, 1994

[54] FLOATING GATE NONVOLATILE MEMORY WITH CONFIGURABLE ERASURE BLOCKS

[75] Inventors: Peter K. Hazen, Sacramento; Sanjay S. Talreja, Citrus Heights; Sherif R. B. Sweha, El Dorado Hills, all of Calif.

[73] Assignee: Intel Corporation, Santa Clara, Calif.

[21] Appl. No.: 901,275

[22] Filed: Jun. 19, 1992

[51] Int. Cl.⁵ .............................................. G11C 11/34
[52] U.S. Cl. .................................... 365/185; 365/218; 365/230.03; 365/189.01
[58] Field of Search .................. 365/230.03, 185, 184, 365/218, 238.5, 230.04, 230.06, 189.01, 189.04, 94, 104

[56] References Cited

U.S. PATENT DOCUMENTS

| | | | |
|---|---|---|---|
| 4,849,943 | 7/1989 | Pfennings | 365/230.03 |
| 4,939,696 | 7/1990 | Katsuo et al. | 365/230.03 |
| 4,949,309 | 8/1990 | Rao | 365/185 |
| 4,958,326 | 9/1990 | Sakurai | 365/218 |
| 4,961,164 | 10/1990 | Miyoaka et al. | 365/230.03 |
| 4,967,399 | 10/1990 | Kuwabara et al. | 365/230.06 |
| 4,977,538 | 12/1990 | Anami et al. | 365/230.03 |
| 5,020,026 | 5/1991 | Schreck et al. | 365/230.06 |
| 5,065,364 | 11/1991 | Atwood et al. | 365/185 |

Primary Examiner—Eugene R. LaRoche
Assistant Examiner—Vu A. Le
Attorney, Agent, or Firm—Blakely, Sokoloff, Taylor & Zafman

[57] ABSTRACT

A nonvolatile memory includes a first block and a second block. The first block comprises a first memory cell and a first source line coupled to a source of the first memory cell. The second block comprises a second memory cell and a second source line coupled to a source of the second memory cell. A first source switch is coupled to the first source line for selectively coupling a first potential, a second potential, and a third potential to the first source line. The second potential has a voltage intermediate between the first potential and the third potential. A second source switch is coupled to the second source line for selectively coupling one of the first, second, and third potentials to the second source line. A block select circuit receives a block address for selecting one of the first and second source switches to couple one of the first, second, and third potentials to its respective one of the first and second source lines. A configuration cell is coupled to the block select circuit for configuring block operations of the first and second blocks. When the configuration cell is in a first voltage state, the configuration cell causes the block select circuit to separately select one of the first and second source switches depending upon the address received. When the configuration cell is in a second voltage state, the configuration cell causes the block select circuit to collectively select the first and second source switches.

20 Claims, 7 Drawing Sheets

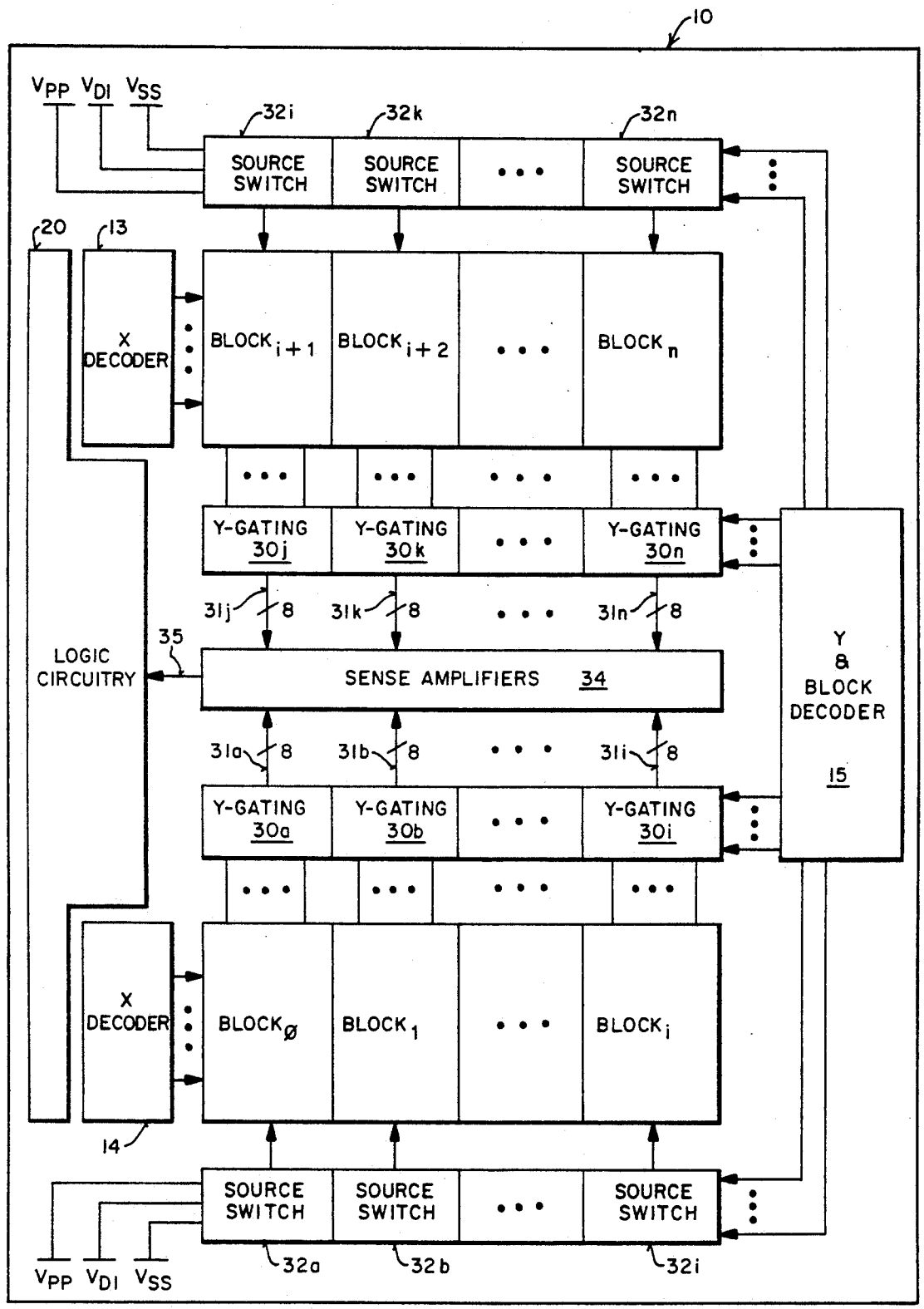
FIG _ 1 (PRIOR ART)

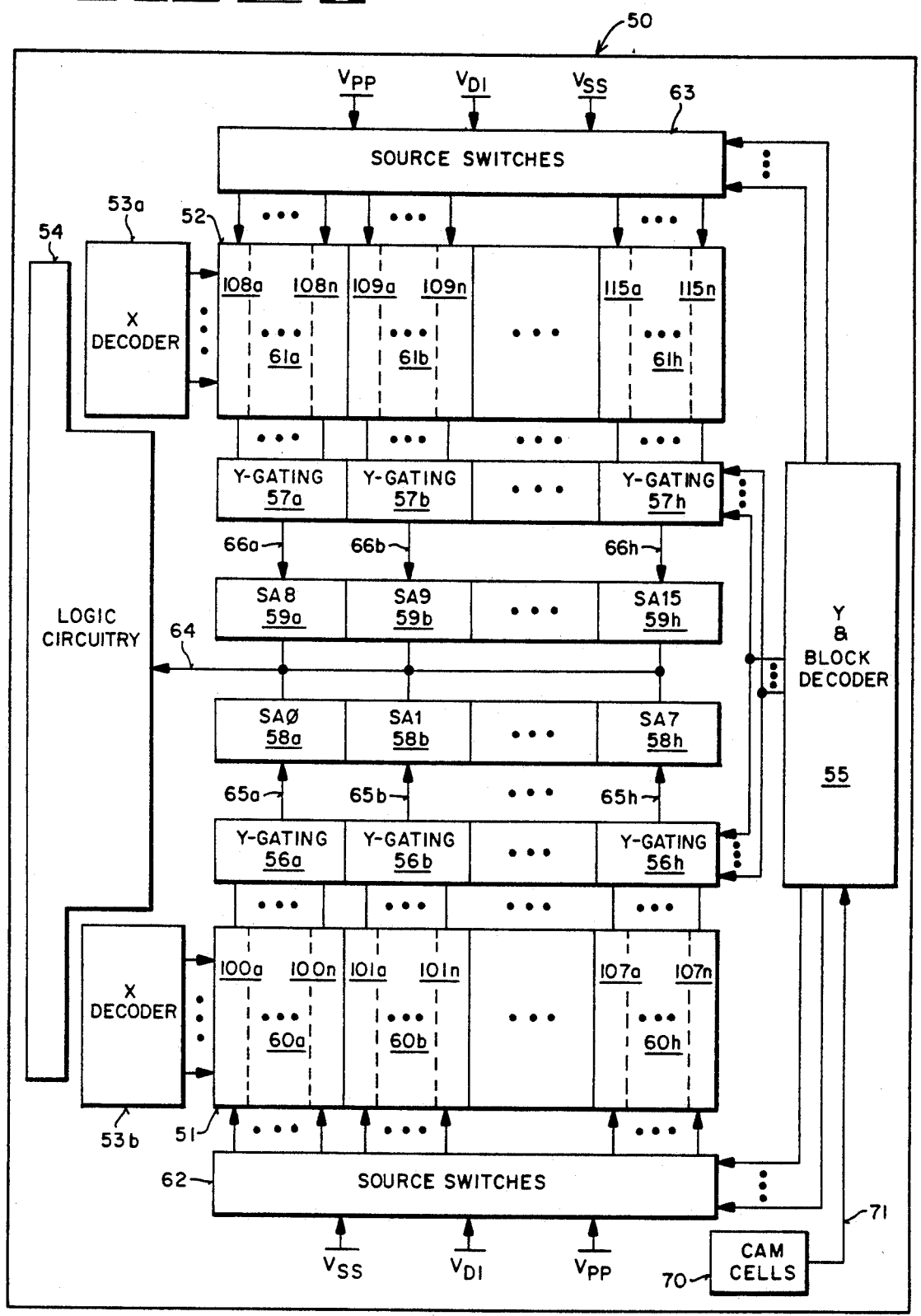

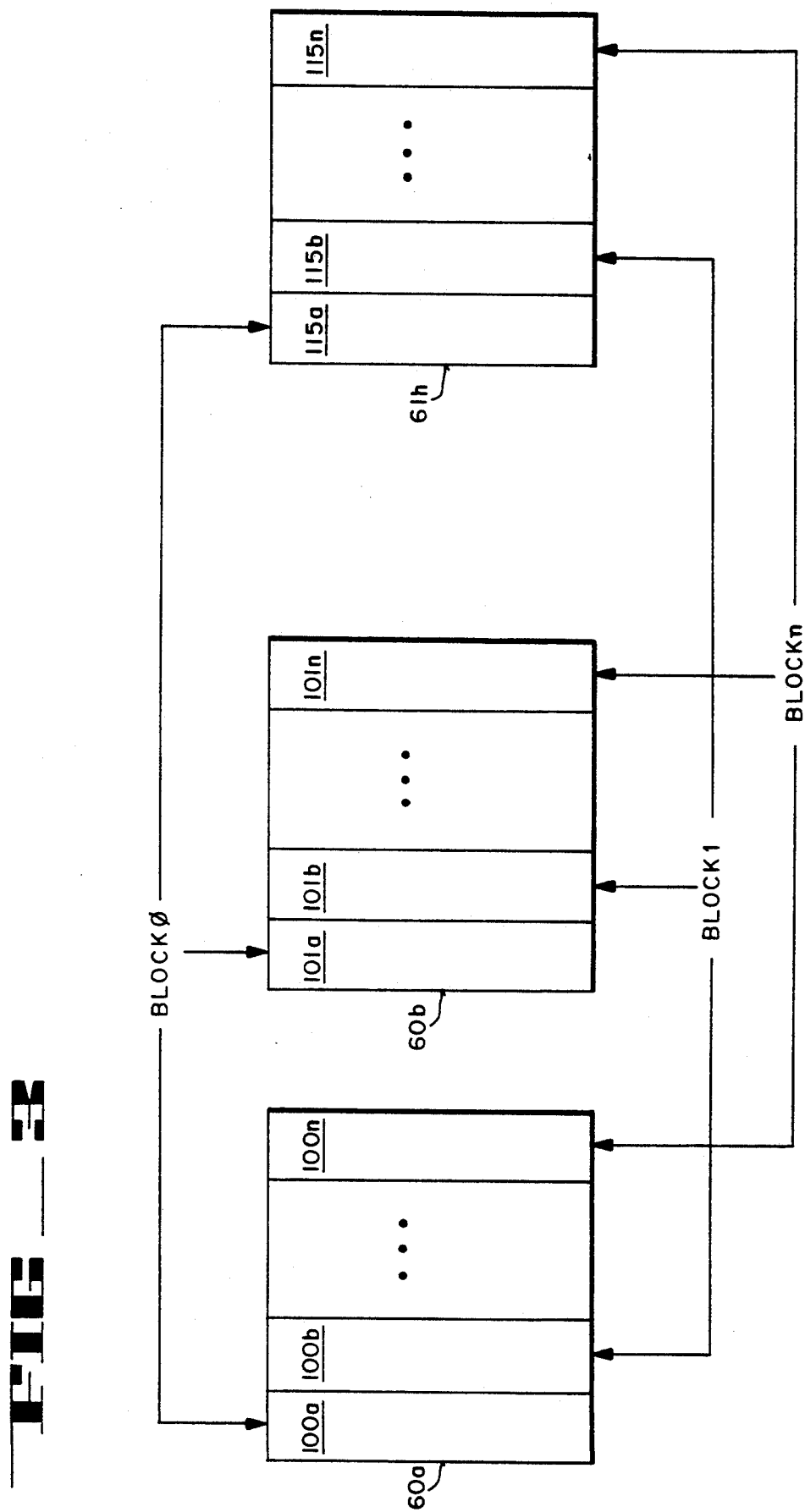

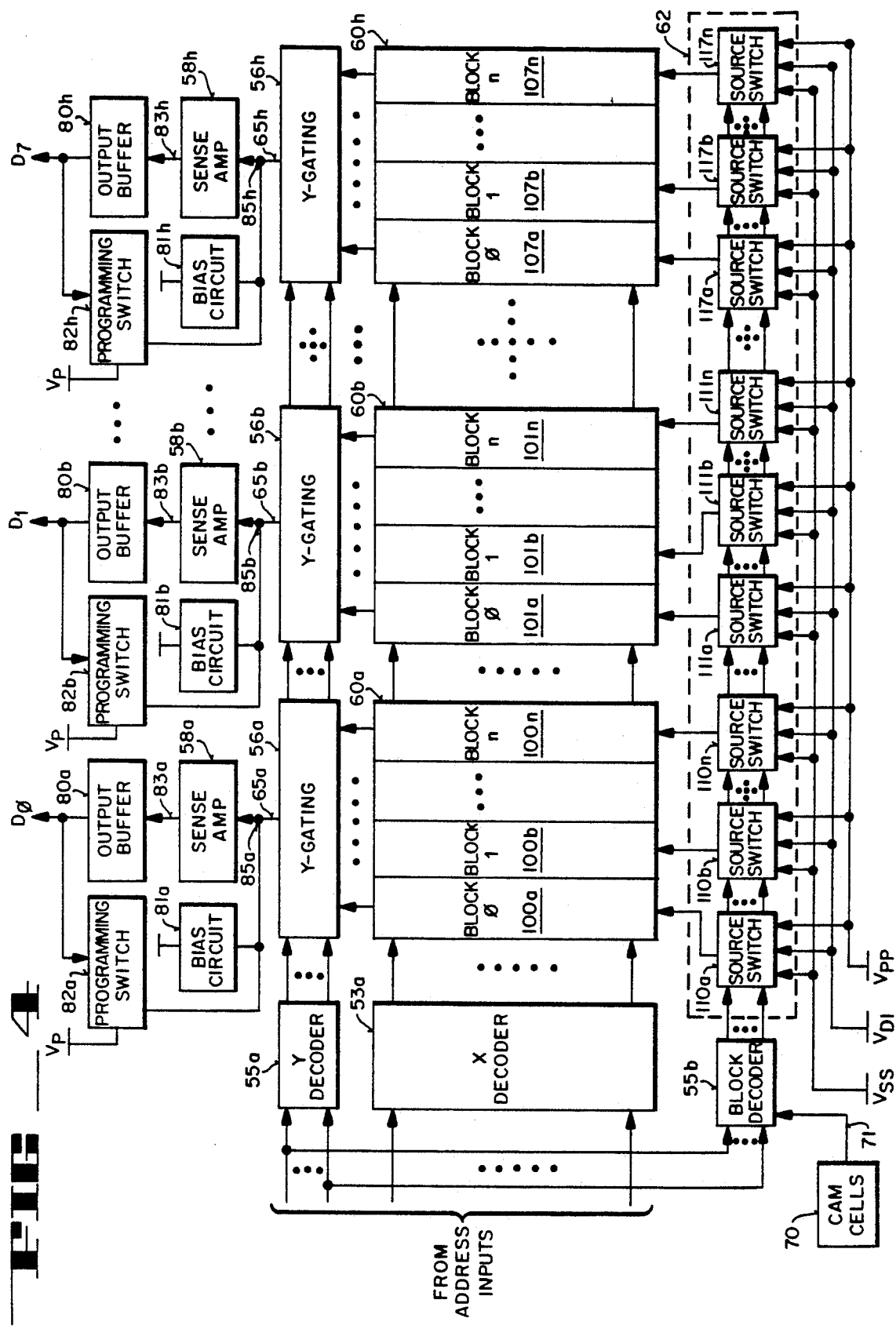

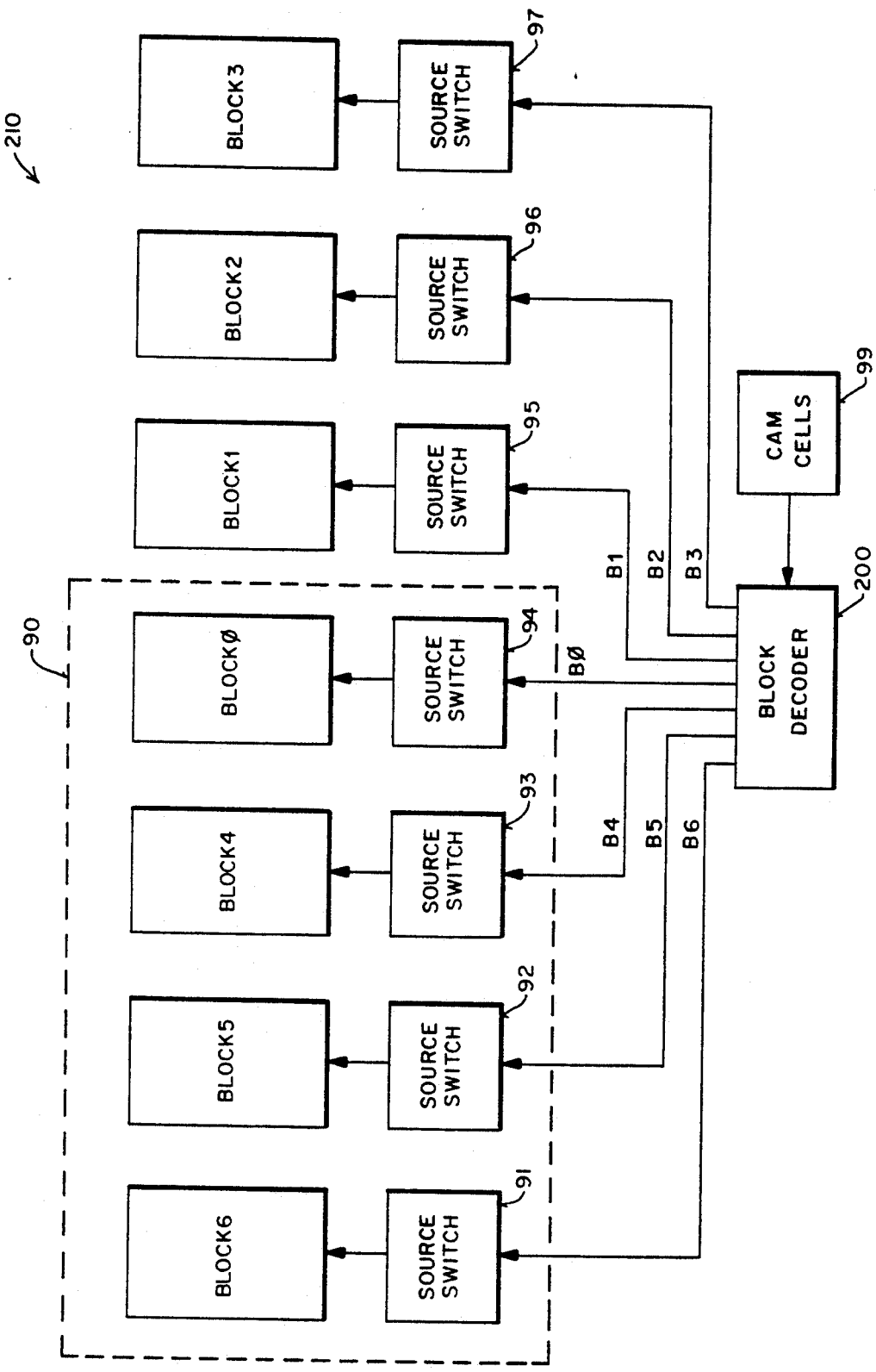

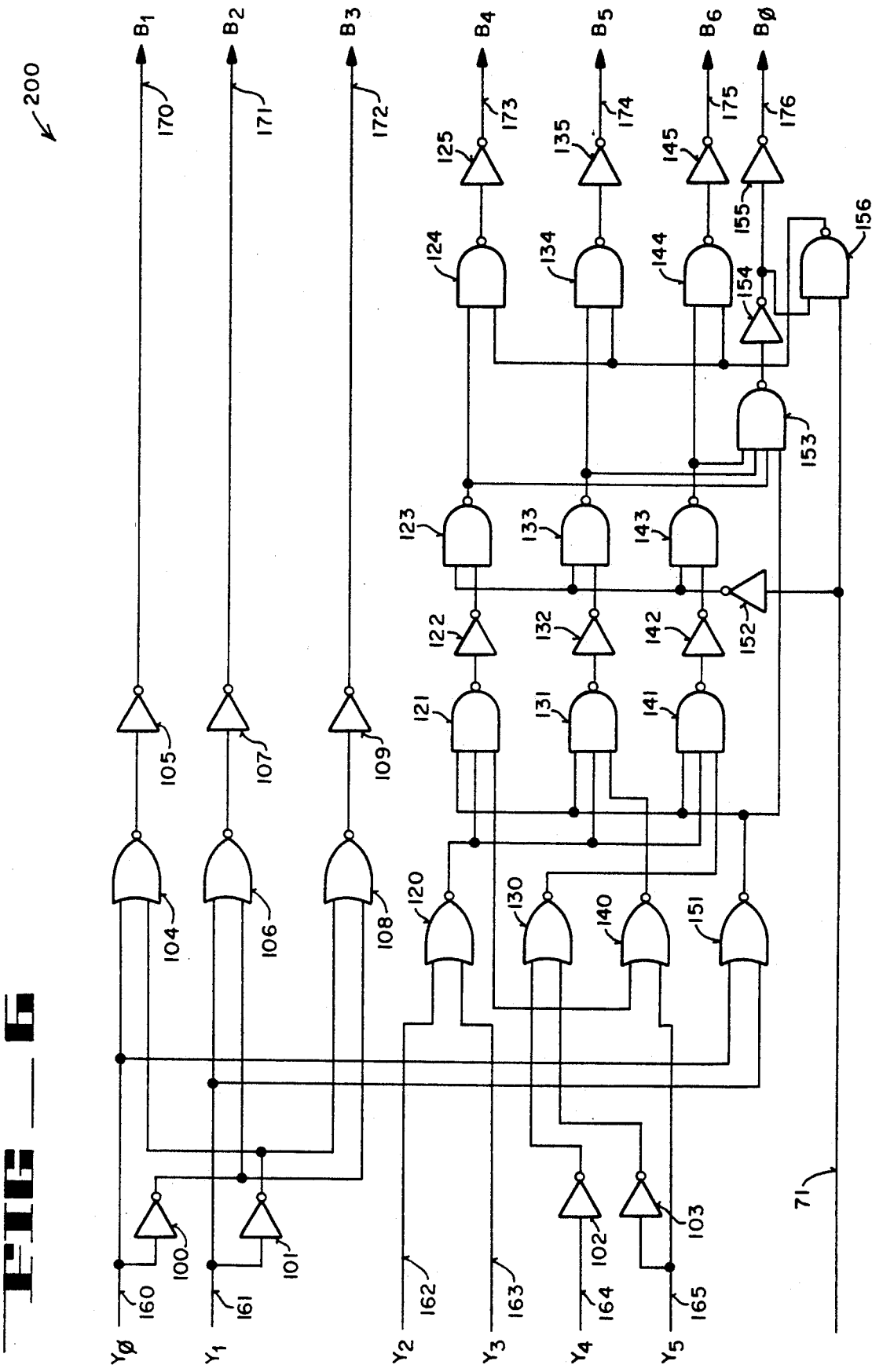
FIG_6

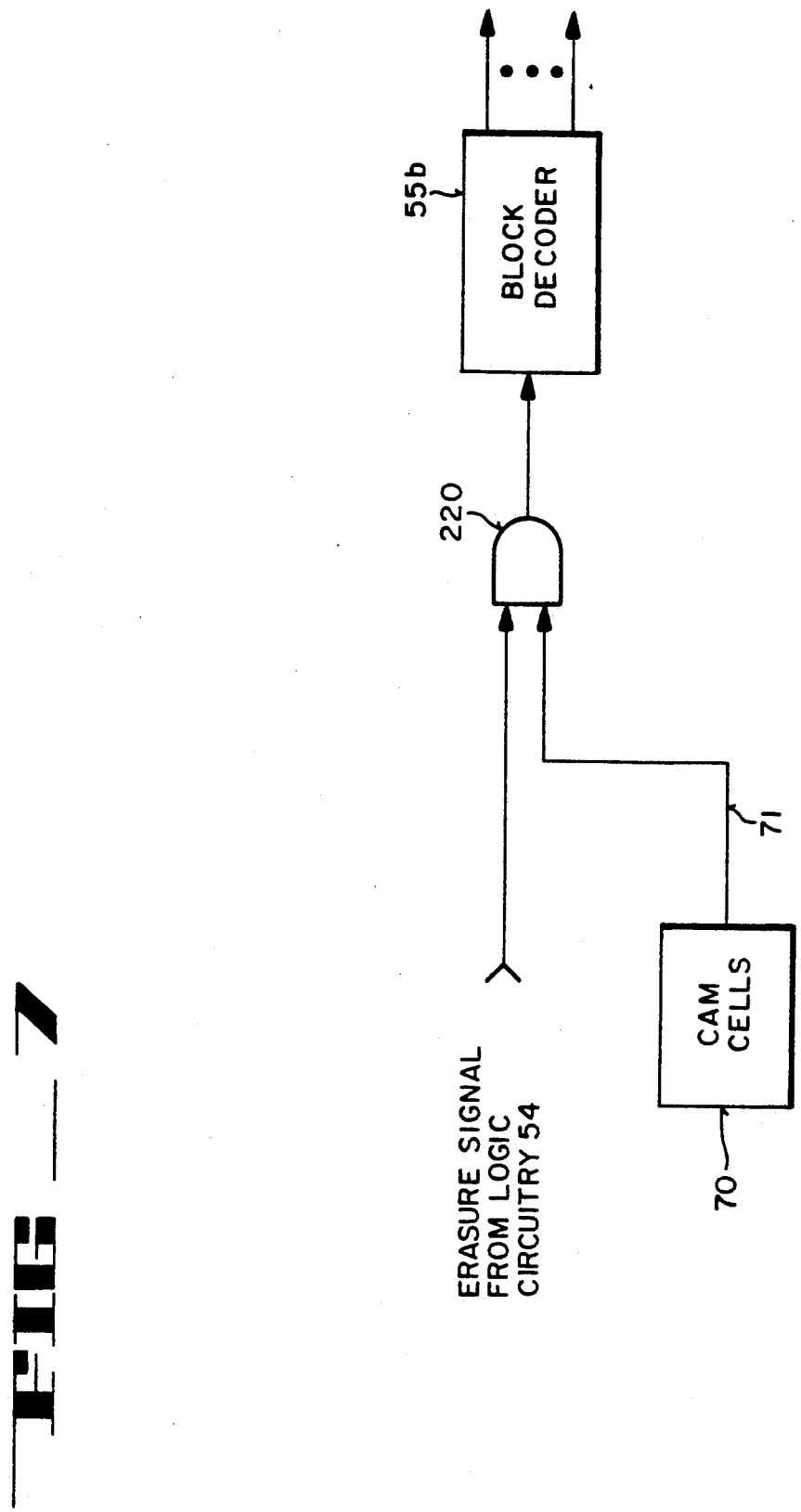

FLOATING GATE NONVOLATILE MEMORY WITH CONFIGURABLE ERASURE BLOCKS

FIELD OF THE INVENTION

The present invention pertains to the field of computer memories. More particularly, this invention relates to a floating gate nonvolatile memory with configurable erasure blocks.

BACKGROUND OF THE INVENTION

One type of prior nonvolatile memory is the flash erasable and electrically programmable read-only memory ("flash EPROM"). A typical flash EPROM is organized into rows and columns. Memory cells are placed at intersections of word lines and bit lines. Each word line is connected to the gates of a plurality of memory cells in one row. Each bit line is connected to the drains of a plurality of memory cells in one column. The sources of all the memory cells are connected to a common source line. The flash EPROM can be programmed, and once programmed, the entire contents of the flash EPROM can be erased by electrical erasure. A high erasing voltage $V_{PP}$ is made available to the source of all the cells simultaneously. This results in a full array erasure. The flash EPROM may then be reprogrammed with new data.

One disadvantage of this prior flash EPROM structure is the characteristics of array erasure. When changes are sought to be made to a program stored in the array, the entire array must be erased and the entire program be rewritten into the array, even when the changes are minor.

One prior approach to solving this problem is to reorganize the array into blocks so that the high erasing voltage is made available only to the source of every cell within one block to be erased. In this arrangement, each block can be individually addressed for read, programming, and erasure operations. By this arrangement, only a block of memory array is erased, rather than having the entire memory array erased.

FIG. 1 illustrates such a typical prior arrangement. In FIG. 1, memory cells of prior flash EPROM 10 are organized into a plurality of bit line blocks BLOCK0 through BLOCKn. Each block can be individually addressed for read, programming, and erasure operations. Each block includes a plurality of bit lines that are connected to sense amplifiers 34 via a respective one of Y gating circuits 30a through 30n. Each of Y gating circuits 30a–30n includes a plurality of column select transistors for selectively connecting eight bit lines (i.e., one byte) at a time from the respective block to sense amplifiers 34. Therefore, each of Y gating circuits 30a–30n includes eight connection lines connected to sense amplifiers 34, respectively. The outputs of sense amplifiers 34 are coupled to data pins of the prior flash EPROM via data lines 35 and via output buffers in logic circuitry 20. Prior flash EPROM 10 also includes a plurality source switches 32a through 32n, each associated with one of blocks BLOCK0 through BLOCKn.

During the read operation, a Y and block decoder 17 selects one byte of bit lines of a selected block for any given address applied. The selected bit lines of the selected block are then connected to sense amplifiers 34 via the associative Y gating circuit. One of X decoders 13 and 14 selects a word line. Sense amplifiers 34 then sense the voltage levels on the selected bit lines to obtain data from the selected memory cells at intersections of the selected bit lines and the selected word line. Sense amplifiers 34 then apply the sensed data to the data pins of prior flash EPROM 10 via data lines 35 and logic circuitry 20.

During the programming operation, decoder 17 selects one byte of bit lines in a selected block for each address applied. One of X decoders 13–14 selects a word line. Programming potentials are applied to the selected bit lines and the selected word line. Decoder 17 selects the source switch associated with the selected block to couple a ground potential $V_{SS}$ to the sources of the memory cells of the selected block and to couple a disturb inhibit potential $V_{DI}$ to the sources of the memory cells of unselected blocks. This is done to help prevent the programming of the selected cells in the selected block from disturbing the memory cells in unselected blocks. During the erasure operation, decoder 17 selects one block by selecting its associative source switch for each address applied. The selected source switch applies the high erasure voltage $V_{PP}$ to the sources of the memory cells of the selected block, thus allowing block erasure of the selected block.

Disadvantages are, however, associated with this prior blocked flash EPROM structure. One disadvantage is that during erasing of a block, some of the memory cells of the block tend to absorb more erasure current than others. This is typically referred to as current "hogging". Current hogging typically arises when, during erasing, some memory cells enter the "Zener breakdown" state while others do not. When a cell is in the Zener breakdown state, a slight voltage increase on the source may lead to a significant increase in current flow through the cell, and vice versa. When the erasing voltage along the common source line of a block varies from point to point, the voltage variations may cause the cells coupled at one point of the source line that are in the Zener breakdown state to sink most of the erasure current. The voltage variations along a source line are typically relatively significant when the memory blocks are relatively large and contain a relatively large number of memory cells. This typically requires the source line of a block to be long in order to connect to the sources of all memory cells in that block. The relatively long source line typically increases the line impedance, which in turn results in voltage variations along the source line being relatively significant.

Another disadvantage of the above-described prior flash EPROM is that the number of the blocks and the size of each of the blocks are both fixed and cannot be altered. Thus, the user of that prior flash EPROM cannot later change the size and the number of the blocks.

SUMMARY AND OBJECTS OF THE INVENTION

One of the objects of the present invention is to provide a nonvolatile memory that is organized into blocks, wherein the size and the number of the blocks can be altered.

Another object of the present invention is to provide a nonvolatile memory with blocks with improved erasure characteristics.

Another object of the present invention is to provide a nonvolatile memory that is organized into blocks, wherein the size and the number of the blocks are user configurable.

Another object of the present invention is to provide a nonvolatile memory that is organized into blocks, wherein current hogging of memory cells in a block during erasing is minimized.

A nonvolatile memory device is described. The memory includes a first block and a second block. The first block comprises a first memory cell, a first bit line coupled to a drain of the first memory cell, and a first source line coupled to a source of the first memory cell. The second block comprises a second memory cell, a second bit line coupled to a drain of the second memory cell, and a second source line coupled to a source of the second memory cell. A word line is coupled to control gates of the first and second memory cells. A first source switch is coupled to the first source line for selectively coupling a first potential, a second potential, and a third potential to the first source line. The second potential has a voltage intermediate between the first potential and the third potential. A second source switch is coupled to the second source line for selectively coupling one of the first, second, and third potentials to the second source line. A block select circuit is provided for selecting one the first and second source switches to couple one of the first, second, and third potentials to its respective one of the first and second source lines. The block select circuit receives a block address for selecting between the first and second source switches. A configuration cell is coupled to the block select circuit for configuring block operations of the first and second blocks. The configuration cell can be in a first voltage state and a second voltage state. When the configuration cell is in the first voltage state, the configuration cell causes the block select circuit to separately select one of the first and second source switches depending upon the address received. When the configuration cell is in the second voltage state, the configuration cell causes the block select circuit to collectively select the first and second source switches.

Other objects, features, and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements, and in which:

FIG. 1 is a physical layout block diagram of one prior flash EPROM that is organized into blocks, wherein each block is associated with a source switch;

FIG. 2 is a physical layout block diagram of a flash EPROM that is organized into blocks, sub-blocks, and data bit groups, wherein the blocks are configurable;

FIG. 3 is a block diagram of the blocks of the flash EPROM;

FIG. 4 is a block diagram of the layout of a portion of the flash EPROM of FIG. 2 with content addressable memory ("CAM") cells and a plurality of source switches, each corresponding to one sub-block;

FIG. 5 is a block diagram showing an embodiment in which four of seven blocks of a flash EPROM are configured into a configuration block;

FIG. 6 is a circuit diagram of a block decoder;

FIG. 7 is a block diagram of the CAM cell, the block decoder, and an AND gate coupled between the CAM cell and the block decoder.

DETAILED DESCRIPTION

FIG. 2 illustrates in block diagram form the physical die layout of a flash EPROM 50, which implements a preferred embodiment of the present invention. Flash EPROM 50 includes a memory array that comprises a first plane 51 and a second plane 52. The memory array is made up of electrically programmable and electrically erasable read-only memory cells that store data at addresses. For one embodiment, the memory array can store 4 megabits ("Mbits") of data. For alternative embodiments, the memory array can store more or fewer than 4 Mbits of data.

For one embodiment, all circuitry of flash EPROM 50 resides on a single substrate, as shown in FIG. 2. For a further embodiment, flash EPROM 50 employs CMOS circuitry.

As will be described in more detail below, the memory array of flash EPROM 50 is organized into bit line blocks. Each block is associated with one of a plurality of source switches. A block decoder is provided to couple to the plurality of source switches. The block decoder selects one of the plurality source switches to couple one of a ground potential $V_{SS}$, a disturb inhibit potential $V_{DI}$, and a programming/erasure potential $V_{PP}$ to a respective block as part of the read, programming, and erasure operations. A configuration cell is provided for configuring block operation of the flash EPROM. The configuration cell is coupled to the block decoder. The configuration cell can be in a first voltage state and a second voltage state. When the configuration cell is in the first voltage state, the configuration cell causes the block decoder to separately select one of the source switches depending upon the address received. When the configuration cell is in the second voltage state, the configuration cell causes the block decoder to collectively select a number of the source switches, depending on the address applied. In this manner, the number of the blocks of the flash EPROM and the size of each block can be selected by a user of the flash EPROM.

Referring to FIG. 2, each of memory planes 51-52 includes a plurality of bit lines and word lines. Each of memory planes 51-52 also includes a number of source lines. Memory cells are formed at intersections of the word lines and the bit lines. Each of the word lines is coupled to the control gates of the memory cells along one row. Each of the bit lines is coupled to the drains of the memory cells along one column. Each of the source lines is coupled to the sources of a number of memory cells within each of memory planes 51 and 52. The configuration of each of memory planes 51 and 52 will be described in more detail below.

Flash EPROM 50 includes sixteen data pins $D_0$ through $D_{15}$. Data pins $D_0$–$D_{15}$ can couple word wide data (i.e., sixteen bits of data) to and from flash EPROM 50. Alternatively, flash EPROM 50 may include more or fewer than sixteen data pins $D_0$–$D_{15}$. For example, flash EPROM 50 may include eight data pins. For that eight data pin embodiment, only byte wide data (i.e., eight bits of data) can be coupled to and from flash EPROM 50 via the eight data pins.

Flash EPROM 50 of FIG. 2 includes a byte wide mode and a word wide mode. When flash EPROM 50 is in the byte wide mode, only half of data pins $D_0$–$D_{15}$ are providing or receiving data (i.e., eight bits) and the other half of data pins $D_0$–$D_{15}$ are left floating. When flash EPROM 50 is in the word wide mode, all data pins $D_0$–$D_{15}$ are providing or receiving data.

Each of data pins $D_0$–$D_{15}$ are associated with a plurality of bit lines in the memory array of flash EPROM 50. For each address applied at flash EPROM 50, each of data pins $D_0$–$D_{15}$ is coupled to a selected bit line of the associative bit lines of that data pin.

Each of memory planes 51–52 is organized into eight groups. As shown, plane 51 is organized into groups 60a through 60h and plane 52 is organized into groups 61a through 61h. Each of groups 60a–60h and 61a–61h includes a plurality of bit lines extending within that group. The bit lines within each group do not extend to adjacent groups. The bit lines within each of groups 60a–60h and 61a–61h are associated with a respective one of data pins $D_0$ through $D_{15}$ of flash EPROM 50. This means that each of groups 60a–60h and 61a–61h corresponds to one of data pins $D_0$–$D_{15}$. For example, data bit group 60a is associated with data pin $D_0$. Data bit group 61h is associated with data pin $D_{15}$.

The bit lines that are accessed by one address are not grouped together on the substrate of flash EPROM 50, but are instead distributed over the entire memory array of flash EPROM 50. All the bit lines of flash EPROM 50 that are associated with the same data pin are grouped together on the substrate of flash EPROM 50 to form each group. Each data pin can provide and receive one bit of data. Therefore, each of groups 60a–60h and 61a–61h is referred to as data bit group. Each of data bit groups 60a–60h and 61a–61h is responsible for coupling one bit of data to or from its respective one of data pins $D_0$–$D_{15}$. The structure of each of data bit groups 60a–60h and 61a–61h will be described in more detail below.

When addressed, each of the data bit groups 60a–60h and 61a–61h has one selected bit line coupled at a time to its respective one of data pins $D_0$–$D_{15}$. For one address applied at flash EPROM 50, one bit line in each of data bit groups 60a–60h and 61a–61h is selected. For another address applied at flash EPROM 50, another bit line in each of data bit groups 60a–60h and 61a–61h is selected. The bit lines that are associated with each address applied at flash EPROM 50 are not grouped together on the substrate of flash EPROM 50, but are instead distributed over the entire memory array of first and second planes 51 and 52. All the bit lines that are associated with the same data pin are grouped together to form each data bit group.

For alternative embodiments, flash EPROM 50 may include more or fewer than sixteen data bit groups. For example, for one alternative embodiment, flash EPROM 50 includes eight data bit groups and eight data pins, each data pin being associated with one of the eight data bit groups. The number of data bit groups of flash EPROM 50, however, needs to be equal to the number of data pins.

The word lines of each of memory planes 51–52 extend over all data bit groups 60a–60h and 61a–61h within each memory plane. For example, the word lines in memory plane 51 extend over all data bit groups 60a–60h and the word lines in memory plane 52 extend over all data bit groups 61a–61h. Therefore, the word lines in plane 51 are shared by and are common to all data bit groups 60a–60h. The word lines in plane 52 are shared by and are common to all data bit groups 61a–61h. In functional terms, each of the word lines in memory plane 51 is connected to one of the word lines of memory plane 52. In other words, the word lines in memory plane 51 also extend to and are shared by all data bit groups 61a–61h in memory plane 52. This is done by having two identical X decoders 53a and 53b receiving the same X address at the same time, which will be described in detail below. Each of K decoders 53a–53b is coupled to the word lines in one of memory planes 51 and 52.

Each of data bit groups 60a–60h and 61a–61h cannot be individually addressed for read, programming, or erasure operations. Each of data bit groups 60a–60h and 61a–61h contributes one bit of data for each address applied to flash EPROM 50.

As shown in FIG. 3, flash EPROM 50 also includes a plurality of blocks BLOCK0 through BLOCKn. Blocks BLOCK0–BLOCKn are not physical blocks. Each of blocks BLOCK0–BLOCKn can be individually addressed for the read, programming, and erasure operations. Blocks BLOCK0–BLOCKn are bit line blocks. Each of blocks BLOCK0–BLOCKn includes a plurality of bit lines. Each block includes the bit lines that are addressed by a set of addresses applied at flash EPROM 50. The bit lines of a block are thus constructed to extend only within that block and are not shared by its adjacent blocks. The bit lines of a block are, however, not grouped physically together on the substrate of flash EPROM 50. The word lines, unlike the bit lines, are shared by and are common to all blocks. The configuration of each block will be described in detail below.

For one embodiment, blocks BLOCK0–BLOCKn include four main blocks, one boot block, and two parameter blocks. For alternative embodiments, flash EPROM 50 may include more or fewer than seven blocks. For example, for certain alternative embodiments, flash EPROM 50 may include four blocks or fourteen blocks.

The boot block of flash EPROM 50 stores, for example, program codes for system initialization and reprogramming algorithms. The boot block typically requires the least amount of updating. The parameter blocks are provided to allow the user to store frequently updated system parameters and configuration information.

Each of blocks BLOCK0–BLOCKn includes sixteen sub-blocks, each associated with one of data pins $D_0$–$D_{15}$. For example, BLOCK0 includes sub-blocks 100a through 115a, BLOCK1 includes sub-blocks 100b through 115b, and BLOCKn includes sub-blocks 100n through 115n. Sub-blocks 100a through 100n are located in data bit group 60a. Sub-blocks 101a through 101n are located in data bit group 60b. Sub-blocks 115a through 115n are located in data bit group 61h. Each of the sixteen sub-blocks of a block is located within one of data bit groups 60a–60h and 61a–61h that is associated with the same data pin. Therefore, each of blocks BLOCK0–BLOCKn is distributed over the entire memory planes 51 and 52 of flash EPROM 50 by its respective sub-blocks.

Each of the sixteen sub-blocks of a block includes all the bit lines of the block that are associated with one of data pins $D_0$–$D_{15}$. For example, sub-block 100a includes the bit lines of BLOCK0 that are associated with data pin $D_0$, and sub-block 100b includes all the bit lines of BLOCK0 that are associated with data pin $D_1$. This means that all the bit lines of a block which are associated with the same data pin are grouped together on the substrate to form the sub-block of the block. Therefore, each of the sixteen sub-blocks within each of blocks BLOCK0–BLOCKn is referred to as data bit sub-block.

The data bit sub-blocks in flash EPROM 50 each cannot be individually addressed for read, programming, and erasure operations. Whenever a block is a selected block, its sixteen sub-blocks are selected sub-blocks. For example, when BLOCK0 is a selected block, sub-blocks 100a–115a are selected sub-blocks.

Returning to FIG. 2, each of data bit groups 60a–60h and 61a–61h includes all the bit lines of flash EPROM 50 that are associated with a respective data pin. Therefore, each of the data bit groups 60a–60h and 61a–61h is formed by all the data bit sub-blocks of blocks BLOCK0–BLOCKn that are associated with the same one of data pins $D_0$–$D_{15}$. Thus, each of data bit groups 60a–60h and 61a–61h includes a plurality of data bit sub-blocks, each belonging to one of blocks BLOCK0–BLOCKn.

As shown in FIG. 2, data bit group 60a includes data bit sub-blocks 100a through 100n. Data bit group 60b includes data bit sub-blocks 101a through 101n and data bit group 61h includes data bit sub-blocks 115a through 115n. Data bit sub-blocks 100a–100n of data bit group 60a each has all its bit lines associated with data pin $D_0$. Data bit sub-blocks 101a–101n of data bit group 60b each has all its bit lines associated with data pin $D_1$ and data bit sub-blocks 115a–115n of data bit group 61h each has all its bit lines associated with data pin $D_{15}$.

Each of data bit sub-blocks in one data bit group belongs to one of blocks BLOCK0–BLOCKn. For example, each of data bit sub-blocks 100a–100n in data bit group 60a belongs to one of blocks BLOCK0–BLOCKn. Likewise, each of data bit sub-blocks 101a–101n in data bit group 60b belongs to one of blocks BLOCK0–BLOCKn. Each of blocks BLOCK0–BLOCKn includes one data bit sub-block in each of data bit groups 60a–60h and 61a–61h. For example, BLOCK0 is formed by sub-blocks 100a, 101a, etc., through 115a in each of data bit groups 60a–60h and 61a–61h. BLOCKn is formed by sub-bocks 100n, 101n, etc., through 115n in each of data bit groups 60a–60h and 61a–61h.

The number of the sub-blocks in each of data bit groups 60a–60h and 61a–61h is equal to the number of blocks BLOCK0–BLOCKn. FIG. 3 illustrates the configuration of each of data bit groups 60a–60h, which will be described in more detail below. Data bit groups 61a–61h each has the same group configuration as that of each of data bit groups 60a–60h.

For alternative embodiments, each of blocks BLOCK0–BLOCKn may include more or fewer than sixteen data bit sub-blocks. For one alternative embodiment, flash EPROM 50 has eight data pins. For that alternative embodiment, each of blocks BLOCK0–BLOCKn has eight data bit sub-blocks, each having its bit lines associated with one of the eight data pins.

Each data bit sub-block in each data bit group has its own common source line coupled to all memory cells within that sub-block. Therefore, each of blocks BLOCK0–BLOCKn includes sixteen source lines, each for one of the sixteen sub-blocks. In this situation, each of data bit groups 60a–60h and 61a–61h includes a number of source lines, each associated with one of the sub-blocks within that data bit group. The number of the source lines in each of data bit groups 60a–60h and 61a–61h equals the number of blocks BLOCK0–BLOCKn.

Flash EPROM 50 also includes (1) sixteen Y gating circuits 56a through 56h and 57a through 57h and (2) sixteen sense amplifiers 58a through 58h and 59a through 59h. Each of Y gating circuits 56a–56h and 57a–57h is coupled to one of data bit groups 60a–60h and 61a–61h. Similarly, each of sense amplifiers 58a–58h and 59a–59h is associated with one of data bit groups 60a–60h and 61a–61h. This is due to the fact that each of data bit groups 60a–60h only corresponds to one of data pins $D_0$–$D_{15}$. Y gating circuits 56a–56h and 57a–57h each provides selective coupling of the bit lines of each of data bit groups 60a–60h and 61a–61h to its respective one of sense amplifiers 58a–58h and 59a–59h. Each of Y gating circuits 56a–56h and 57a–57h selectively couples one of the bit lines of its respective one of data bit groups 60a–60h and 61a–61h to its respective one of sense amplifiers 58a–58h and 59a–59h during the read operation of flash EPROM 50. For example, Y gating circuit 56a can selectively couple one of the bit lines within data bit group 60a to sense amplifier 58a. Y gating circuit 57a can selectively couple one of the bit lines of data bit group 61a to sense amplifier 59a. The outputs of sense amplifiers 58a–58h and 59a–59h are coupled to sixteen output buffers (not shown) inside logic circuitry 54 via data bus 64. The output of each of the output buffers is then applied to a respective one of data pins $D_0$ through $D_{15}$.

Each of Y gating circuits 56a–56h and 57a–57h may also couple a programming potential $V_P$ to the selected bit line of its respective data bit group during the programming operation via a programming switch (not shown in FIG. 2), which will be described in more detail below.

Because each of Y gating circuits 56a–56h and 57a–57h is coupled to one of data bit groups 60a–60h and 61a–61h and because each data bit group corresponds to one of data pins $D_0$–$D_{15}$, each of Y gating circuits 56a–56h and 57a–57h only selects one bit line for every Y address applied to flash EPROM 50. This means that each of Y gating circuits 56a–56h and 57a–57h requires only one connection line to connect to its associative one of sense amplifiers 58a–58h and 59a–59h. As shown in FIG. 2, Y gating circuit 56a is coupled to sense amplifier 58a via connection line 65a. Y gating circuit 56 is coupled to sense amplifier 58b via connection line 65b and Y gating circuit 57a coupled to sense amplifier 59a via connection line 66a, etc. Each of sense amplifiers 58a–58h and 59a–59h can be placed very close to its respective one of Y gating circuits 56a–56h and 57a–57h, thus causing the length of each of connection lines 65a–65h and 66a–66h to be minimized.

Given that only one sense amplifier is required for each data bit group, no connection line is required to connect the bit lines of a data bit group to each of all other sense amplifiers. In addition, each of sense amplifiers 58a–58h can be placed close to its respective one of data bit groups 60a–60h and 61a–61h. Thus, the lengths of the bit lines in each of data bit groups 60a–60h and 61a–61h are substantially minimized and are substantially uniform. This causes the line impedance and line capacitance of each of the bit lines in each of data bit groups 60a–60h and 61a–61h to be accordingly minimized, which improves the total access time of flash EPROM 50.

Logic circuitry 54 of flash EPROM 50 includes other circuits besides the output buffers. For example, logic circuitry 54 can include write state circuitry and command state circuitry. The write state circuitry controls the sequences of the programming and erasure operations of flash EPROM 50. The command state circuitry decodes command received from external circuitry and generates the appropriate control signals to the write state circuitry.

Flash EPROM 50 also includes source switches 62 and 63. Source switches 62 comprise a plurality of source switches, each connected to the common source line of one of the data bit sub-blocks in each of data bit groups 60a–60h. Likewise, source switches 63 comprise a plurality of source switches, each connected to the common source line of one of the data bit sub-blocks in each of data bit groups 61a–61h. Each of the plurality of source switches 62 couples one of a ground potential $V_{SS}$, a disturb inhibit potential $V_{DI}$, and a programming/erasure potential $V_{PP}$ to the source of all cells within its respective data bit sub-block of each of data bit groups 60a–60h and 61a–61h as part of the read, programming, and erasure operations via the respective common source line. Each of the plurality of switches of source switches 62 and 63 may be ordinary switch that comprises a set of FET transistors.

Flash EPROM 50 includes two identical X decoders 53a and 53b, and a Y and block decoder 55. X decoder 53a is the row decoder for memory plane 51 and X decoder 53b is the row decoder for memory plane 52. Y and block decoder 55 is the column decoder and block selector for memory planes 51 and 52. Addresses are applied to decoders 53a–53b and 55.

X decoder 53a is coupled to the word lines of memory plane 51 and X decoder 53b is coupled to the word lines of memory plane 52. X decoders 53a and 53b receive the same X addresses at the same time. Therefore, X decoders 53a and 53b can be considered one X decoder and each of the word lines of first memory plane 51 is extended to connect to its associative one of the word lines in second memory plane 52. In other words, a word line is common to and is shared by all data bit groups 60a–60h and 61a–61h. X decoders 53a and 53b each selects one word line in accordance with each of the X addresses applied at both decoders 53a and 53b in one of read and programming operations. X decoders 53a–53b each may be any ordinary decoder available.

For an alternative embodiment, flash EPROM 50 includes one X decoder and each of the word lines of memory plane 51 are connected to one of the word lines in memory plane 52.

In FIG. 2, Y and block decoder 55 is coupled, via each of Y gating circuits 56a–56h and 57a–57h, to the bit lines of each of data bit groups 60a–60h and 61a–61h. Y and block decoder 55 receives the Y addresses of flash EPROM 50. Y and block decoder 55 selects a selected bit line from one data bit sub-block of each of data bit groups 60a–60h and 61a–61h for every Y address applied to undergo the read or programming operation. The sub-blocks of data bit groups 60a–60h and 61a–61h that include the selected bit lines are the selected sub-blocks. The selected sub-blocks in data bit groups 60a–60h and 61a–61h belong to one of blocks BLOCK0–BLOCKn. In other words, for each Y address applied, one of blocks BLOCK0–BLOCKn is a selected block. The selected bit lines of the selected block are distributed over all of data bit groups 60a–60h and 61a–61h of memory planes 51 and 52. For any given Y address, only one block is a selected block in flash EPROM 50. Y and block decoder 55 causes Y gating circuits 56a–56h and 57a–57h to connect the selected bit lines of the selected sub-blocks in each of data bit groups 60a–60h and 61a–61h to sense amplifiers 58a–58h and 59a–59h, respectively, during the read operation. Y and block decoder 55 causes Y gating circuits 56a–56h and 57a–57h to connect the selected bit lines for the selected sub-blocks in each of data bit groups 60a–60h and 61a–61h to the programming switches, respectively, during the programming operation. Y and block decoder 55 may be any ordinary decoder.

For an alternative embodiment, Y and block decoder 55 may select one byte of bit lines from either data bit groups 60a–60h for each Y address applied. For this alternative embodiment, flash EPROM 50 is in the byte wide mode. An additional signal is required to cause Y and block decoder 55 to select the selected bit lines from either plane 51 or plane 52.

Y and block decoder 55 is also coupled to source switches 62 of plane 51 and source switches 63 of plane 52. Y and block decoder 55 selects one of blocks BLOCK0–BLOCKn by selecting the associative source switches of all the sub-blocks of the selected block for any Y address applied. Again, for any given Y address, only one block is a selected block. The block decoding function of decoder 55 comes from an intermediate decoding stage of the Y decoding for selecting the bit lines in the selected block. This is because only a subset of the Y address is required to determine which block is the selected block and conversely which blocks are not selected. Y and block decoder 55 may include two separate decoders.

Y and block decoder 55 selects the source switches associated with one of blocks BLOCK0–BLOCKn of memory planes 51 and 52 to couple one of $V_{SS}$, $V_{DI}$, and $V_{PP}$ potentials to the selected block and one of the $V_{SS}$, $V_{DI}$, and $V_{PP}$ potentials to the unselected blocks during one of the read, programming, and erasure operations, which will be described below.

For one embodiment, $V_{PP}$ is approximately 12 volts and $V_{DI}$ is approximately 3.5 volts. For another embodiment, $V_{DI}$ is approximately 2 volts. The purpose of having the disturb inhibit potential is to apply the $V_{DI}$ potential to the sources of memory cells in unselected blocks during programming to prevent the cells along a selected word line in the unselected blocks to be programmed. The $V_{DI}$ potential is low enough to prevent erasing of memory cells along unselected word lines in unselected blocks and yet high enough to prevent programming of cells along the selected word line of the unselected blocks.

FIG. 4 illustrates in block diagram form the configuration of first memory plane 51 with respect to its related circuits in more detail. The configuration of second memory plane 52 with respect to its related circuits is identical to that of memory plane 51 with respect to its related circuits.

In FIG. 4, each of data bit groups 60a–60h has a plurality of data bit sub-blocks, each belonging to one of blocks BLOCK0–BLOCKn. For example, sub-block 100a of data bit group 60a belongs to BLOCK0 and sub-block 100n of data bit group 60a belongs to BLOCKn. Similarly, sub-block 107a of data bit group 60h belongs to BLOCK0 and sub-block 107n of data bit group 60h belongs to BLOCKn. Each of the sub-blocks in each of data bit groups 60a–60h is associated with one of source switches 62. As shown source switches 62 include switches 110a through 110n, each associated with one of sub-blocks 100a–100n of data bit group 60a. Source switches 62 also include switches 111a through 111n, each associated with one of sub-blocks 101a–101n of data bit group 60b. In addition, switches 117a–117n of source switches 62 each is associated with one of sub-blocks 107a–107n of data bit group 60h. A block decoder 55b is coupled to source switches 62. Block decoder 55b is part of Y and block decoder 55 of FIG. 2. Y and block decoder 55 of FIG. 2 also includes a Y decoder 55a. Block decoder 55b selects one source switch from switches 110a–110n, 111a–111n, etc., through 117a–117n, respectively, for each Y (i.e., block) address applied. For example, when BLOCK0 is a selected block, block decoder 55b selects source switches 110a, 111a, etc., through 117a in memory plane 51 to couple one of the $V_{SS}$, $V_{DI}$, and $V_{PP}$ potentials to selected sub-blocks 100a through 107a of selected block BLOCK0 in each of data bit group 60a–60h of memory plane 51.

As also shown in FIG. 4, each of data bit groups 60a–60h has its bit lines coupled to its respective one of Y gating circuits 56a–56h. Each of Y gating circuits 56a–56h provides selective coupling to its bit lines and selects a selected bit line from its respective one of data bit group 60a–60h. Each of Y gating circuits 56a–56h is controlled by Y decoder 55a. Each Y gating circuit selects the selected bit line from one of the sub-blocks in its respective data bit group. Each Y gating circuit then couples the selected bit line from its respective data bit group to its associative bias circuit and sense amplifier during the read operation. Each Y gating circuit couples the selected bit line from its respective data bit group to its associative programming switch during the programming operation. For example, during the read operation, Y gating circuit 56a couples the selected bit line from data bit group 60a to sense amplifier 58a and bias circuit 81a via line 65a. The output of sense amplifier 58a is then applied to data pin $D_0$ via output buffer 80a ad via line 83a. During programming operation, Y gating circuit 56a couples the selected bit line from data bit group 60a to programming switch 82a via line 65a. Programming switch 82a selectively applies the $V_P$ potential to the selected bit line of data bit group 60a depending upon the data applied on data pin $D_0$.

Referring now to FIGS. 2 and 4, flash EPROM 50 includes a plurality of content addressable memory ("CAM") cells 70. CAM cells 70 are coupled to Y and block decoder 55 via line 71. CAM cells 70 are used to store configuration information for configuring the blocks of flash EPROM 50 by configuring block decoder 55b of Y and block decoder 55. For one embodiment, CAM cells 70 use one CAM cell to store the information for configuring Y and block decoder 55. For another embodiment, CAM cells 70 use a number of cells to store the information for configuring Y and block decoder 55. CAM cells 70 are formed by flash EPROM cells. The circuitry of a CAM cell can be any known CAM cell circuitry.

CAM cells 70 are located peripherally to the memory array of first and second memory planes 51 and 52. For alternative embodiments, CAM cells 70 can be located anywhere within flash EPROM 50. CAM cells 70 are used to configure blocks BLOCK0–BLOCKn into different block configurations after flash EPROM 50 is manufactured. CAM cells 70 do this by storing the configuration information that can cause block decoder 55b (FIG. 4) of Y and block decoder 55 (FIG. 2) to collectively select the source switches for a number of blocks BLOCK0–BLOCKn at the same time for each Y address applied, thus configuring blocks BLOCK0–BLOCKn into new block configurations.

For example, when CAM cells 70 are programmed to store the configuration information that indicates every two adjacent blocks of blocks BLOCK0–BLOCKn are configured into a new configuration block, the information is applied to block decoder 55b whenever flash EPROM 50 undergoes an operation. Block decoder 55b then is controlled to select the source switches for respective paired blocks for each address applied.

For one embodiment, the configuration information configures blocks BLOCK0–BLOCKn into two configuration blocks, each having half of blocks BLOCK0–BLOCKn. For another embodiment, blocks BLOCK0–BLOCKn includes seven blocks and the configuration information configures four of the seven blocks into one configuration block. For a further embodiment, every two of blocks BLOCK0–BLOCKn are configured by the configuration information in CAM cells 70 into a new configuration block.

FIG. 5 illustrates in block diagram form an example in which four of seven blocks BLOCK0 through BLOCK6 of a flash EPROM 210 can be configured into a new configuration block 90. In FIG. 5, flash EPROM 210 includes blocks BLOCK0 through BLOCK6. Blocks BLOCK0, BLOCK4 through BLOCK6 can be configured by CAM cells 99 into configuration block 90. After configuration, whenever one of blocks BLOCK0, BLOCK4–BLOCK6 is a selected block, the remaining blocks of BLOCK0, BLOCK4–BLOCK6 are also selected. The total number of blocks then becomes four, with one block being a configuration block.

Referring back to FIGS. 2 and 4, given that CAM cells 70 are formed by flash EPROM cells, they can be electrically erased and reprogrammed. Therefore, the configuration information of flash EPROM 50 stored in CAM cells 70 can be erased and new configuration information can be programmed into CAM cells 70 after the erasure operation. This means that flash EPROM 50 can be reconfigured by a user after the initial configuration.

Initially, the entire flash EPROM 50 of FIG. 2 is erased before being programmed to store data at addresses. After initial programming, flash EPROM 50 can be read, erased, and reprogrammed. It is expected that some of blocks of BLOCK0–BLOCKn may be selected for reprogramming after initial programming. In this situation, only the block or blocks requiring reprogramming are erased and reprogrammed.

During the read operation of flash EPROM 50, X decoders 53a and 53h receive an X address to select one word line of the memory array of planes 51 and 52. Y and block decoder 55 receives a Y address to select one bit line from a selected sub-block in each of data bit groups 60a–60h and 61a–61h. Therefore, a word of bit lines are selected for each Y address applied. Y and block decoder 55 selects the selected bit lines from data bit groups 60a–60h and 61a–61h via each of Y gating circuits 56a–56h and 57a–57h. For any given Y address applied, each of data bit groups 60a–60h and 61a–61h has a selected sub-block that includes the selected bit line of the data bit group. The selected sub-blocks in all of data bit groups 60a–60h and 61a–61h form the selected block. Each selected bit line is connected to a respective one of sense amplifiers 58a–58h and 59a–59h via a respective one of connection lines 65a–65h and 66a–66h. For example, the selected bit line from data bit group 60a is coupled to sense amplifier 58a via Y gating circuit 56a and connection line 65a. The selected bit line from data bit group 60b is coupled to sense amplifier 58b via Y gating circuit 56b and connection line 65b, etc.

Y and block decoder 55 also selects the source switches of source switches 62 and 63 that are associated with the selected sub-blocks of the selected block in all of data bit groups 60a–60h and 61a–61h to couple the $V_{SS}$ potential to the source of all the cells of the selected block when CAM cells 70 are not programmed with the configuration information. When CAM cells 70 are programmed with the configuration information, block decoder 55b is controlled by the configuration information stored in CAM cells 70 via line 71 to select the source switches of switches 62 and 63 associated with the block or blocks that are configured together with the selected block. For example, when the information stored in CAM cells 70 indicates that adjacent two of blocks BLOCK0–BLOCKn are configured together to form a new block for operation, block decoder 55b (FIG. 4) selects the source switches of switches 62 and 63 that are associated with the sub-blocks of BLOCK0 and BLOCK1 when BLOCK0 or BLOCK1 is the selected block.

Memory cells at intersections of the selected word line and the selected bit lines are the selected cells. A read voltage of approximately 5 volts is maintained on the selected word line. A potential of approximately one volt is maintained on the selected bit lines. Sense amplifiers 58a–58h and 59a–59h then read out the data stored in the selected cells via the selected bit lines. Whether a selected cell stores logical high or logical low bit information is determined by the conductivity of the cell. Sense amplifiers 58a–58h and 59a–59h then apply the data read from the selected cells to the output buffers located in logic circuitry 54 via data bus 64. Data bus 64 has sixteen data lines, each coupled to one of sense amplifiers 58a–58h and 59a–59h.

When flash EPROM 50 is in the byte wide mode, Y and block decoder 55 selects one byte of selected bit lines from either memory plane 51 or memory plane 52. In this situation, only half of sense amplifiers 58a–58h and 59a–59h read the byte wide data from the selected bit lines.

During the programming operation, X decoders 53a and 53b receive an X address to select a word line of the memory array of memory planes 51 and 52. Y and block decoder 55 receives a Y address to select a bit line from a selected sub-block in each of data bit groups 60a–60h and 61a–61h. Y and block decoder 55 does so via each of Y gating circuits 56a–56h and 57a–57h. For any given Y address, each of data bit groups 60a–60h and 61a–61h has a selected sub-block that includes the selected bit line of that data bit group. The selected sub-blocks in all of the data bit groups constitute the selected block.

Y and block decoder 55 also selects the source switches of source switches 62 and 63 that are associated with the selected sub-blocks of the selected block when CAM cells 70 are not programmed with the configuration information. When CAM cells 70 are programmed with the configuration information, block decoder 55b of Y and block decoder 55 of FIG. 2 is controlled by the configuration information stored in CAM cells 70 via line 71 to select the source switches of switches 62 and 63 associated with the block or blocks that are configured together with the selected block. For example, when the configuration information indicates that blocks BLOCK0–BLOCK3 are configured together to form a new block, block decoder 35b (FIG. 4) selects the source switches of switches 62 and 63 that are associated with the sub-blocks of BLOCK0–BLOCK3 when any one of blocks BLOCK0–BLOCK3 is the selected block. The programming potential $V_{PP}$ is applied to the selected word line and a programming potential $V_P$ is selectively applied to each of the selected bit lines via one of the programming switches. Whether the $V_P$ potential is applied to a particular selected bit line depends on the data applied to the associative one of data pins $D_0$–$D_{15}$. For example, when data pin $D_0$ receives a logical high data bit, the selected bit line in data bit group 60d is applied with the $V_P$ potential. For one embodiment, the $V_P$ potential is approximately 7 volts.

Meanwhile, when CAM cells 70 are not programmed with the configuration information, the selected source switches for the selected sub-blocks of the selected block in each of data bit groups 60a–60h and 61a–61h couple the $V_{SS}$ potential to the sources of the cells in the selected block. The source switches of switches 62 and 63 for the unselected sub-blocks of the unselected blocks couple the $V_{DI}$ potential to the sources of the memory cells in all the unselected blocks to prevent the memory cells along the selected word line in the unselected blocks from being disturbed by the programming of the selected memory cells in the selected block along the selected word line.

When CAM cells 70 are programmed with the configuration information, the source switches for the selected block and the source switches for the block or blocks that are configured together with the selected block are both selected by block decoder 55b to couple the $V_{SS}$ potential to the sources of the cells in the selected block and the sources of the cells in the blocks configured with the selected block. The source switches for the unselected blocks then couple the $V_{DI}$ potential to the sources of the cells in all unselected blocks to prevent the memory cells along the selected word lines in the unselected blocks from being disturbed by the programming of the selected memory cells in the selected block along the selected word line.

For example, when CAM cells 70 are programmed to configure BLOCK0 and BLOCK1 together, block decoder 55b is controlled by the information in CAM cells 70 to select the source switches for blocks BLOCK0–BLOCKn to couple the $V_{SS}$ potential to the sources of the cells in blocks BLOCK0–BLOCK1 when either BLOCK0 or BLOCK1 is a selected block. Block decoder 55b, meanwhile, causes the source switches for blocks BLOCK2–BLOCKn to couple the $V_{DI}$ potential to the sources of the cells in the unselected blocks.

For another embodiment, as shown in FIG. 7 the configuration function of CAM cells 70 to block decoder 55b can be disabled during the programming operation. This can be done by having an AND gate 220 connected to receive the configuration information and an erasure operation signal. The configuration information is therefore ANDed with the erasure operation signal. The erasure operation signal is an active high signal. When flash EPROM 50 is not in the erasure operation, the erasure operation signal is at logical low level which blocks the AND gate 220 not to output the configuration information to block decoder 55b. This disables the configuration to block decoder 55b during the read and programming operation. Thus, the $V_{DI}$ potential can be applied to the sources of the cells in all the unselected blocks. For this situation block decoder 55b only selects the source switches for the selected block no matter whether CAM cells 70 have been programmed to store the configuration information or not. When the erasure operation signal is at logical high level which indicates that flash EPROM 50 is in the erasure operation, the AND gate 220 is enabled to allow the configuration information to be applied to block decoder 55b.

During the block erasure operation, block decoder 55b receives a Y address to select the source switches for all the sub-blocks of a selected block when CAM cells 70 are not programmed with the configuration information. Y decoder 55a is disabled. The selected source switches of source switches 62 and 63 then couple the erasure potential $V_{PP}$ to the sources of all cells within all the selected sub-blocks of the selected block. X decoders 53a-53b couple a ground potential to all word lines of memory planes 51 and 52. The bit lines of the selected block are allowed to float during the block erasure operation.

When CAM cells 70 are programmed with the configuration information, block decoder 55b is controlled by the configuration information stored in CAM cells 70 to select the source switches for the selected block and the block or blocks that are configured with the selected block for the block erasure operation. The $V_{PP}$ potential is then coupled to the sources of the cells in the selected block and the blocks configured with the selected block via the selected source switches. For example, when the configuration information in CAM cells 70 indicates that BLOCK1-BLOCK3 of flash EPROM 50 are configured with BLOCK0, block decoder 55b then is controlled by the information in CAM cells 70 via line 71 to select the source switches for blocks BLOCK0-BLOCK3 to couple the $V_{PP}$ potential to the sources of the cells in these blocks.

For alternative embodiments, blocks BLOCK0-- BLOCKn are physical blocks. Each block includes a plurality of bit lines that are physically grouped together on the substrate. For these alternative embodiments, source switches 62 and 63 include a plurality of source switches, each associated with one of blocks BLOCK0-BLOCKn. Each source switch within source switches 62 and 63 couples one of the $V_{SS}$, $V_{DI}$, and $V_{PP}$ potentials to the sources of all cells with its respective block during one of the read, programming, and erasure operations via a common source line. When CAM cells 70 are not programmed with the configuration information, block decoder 55b selects one of the source switches associated with the selected block for each address applied. When CAM cells 70 are programmed to store the configuration information, block decoder 55b selects the source switches for the selected block and the block or blocks that are configured together with the selected block by the configuration information in CAM cells 70.

FIG. 6 illustrates in circuitry diagram form block decoder 200 of FIG. 5 that can be controlled by the configuration information. Block decoder 200 of FIG. 6 illustrates one example of the present invention. Block decoder 200 is used to select among the source switches that are associated with seven blocks. Block decoder 200 can be block decoder 55b when flash EPROM 50 of FIG. 2 is organized into seven blocks.

Referring to FIG. 6, block decoder 200 receives the configuration information via line 71. Block decoder 200 also receives its block address Y0 through Y5 via address lines 160 through 165. Block decoder 200 provides seven block select signals B0 through B6 (active low) via lines 170 through 176, each coupled to one source switch that is associated with one of seven blocks. For example, select signal B0 is used to select the source switch for BLOCK0, select signal B1 is used to select the source switch for BLOCK1.

Line 71 receives the configuration information, which is an active high signal. The configuration indicates that blocks BLOCK0, BLOCK4-BLOCK6 are grouped together to form a new configuration block. When block decoder 200 receives the configuration information, it collectively applies logical low select signals B0, B4-B6 on lines 173-176 when the address Y0-Y5 applied at lines 160-165 indicates that any one of blocks BLOCK0, BLOCK4-BLOCK6 is a selected block. The operation of block decode 200 with respect to the configuration information is described below.

When line 71 receives a logical low signal, the configuration information is not applied to block decoder 200. In this case, NAND gates 123, 133, and 143 are not blocked and NAND gates 124, 134, and 144 are not blocked. Block decoder 200 outputs a logical active low select signal at one of lines 170-176 for each block address applied.

When line 71 is at logical high level, the configuration information is applied to block decoder 200. In this situation, NAND gates 123, 133, and 143 are blocked to output logical high signals. The output of NAND gate 153 depends on the output of NOR gate 151. NOR gate 151 receives the address signals that indicate whether any one of the B1-B3 select signals should be active low. If not, NOR gate 151 outputs a logical high signal to NAND gate 153, which eventually causes the B0, B4-B6 block select signals to be active low regardless of the Y2-Y5 address applied at lines 162-165. In this situation, block decoder 200 collectively selects blocks BLOCK0, BLOCK4-BLOCK6. If the block address applied indicates that one of B1-B3 select signals should be active low. NOR gate 151 outputs a logical low signal, which causes NAND gate 156 to output a logical high signal. In this situation, all of signal lines 173-176 are at logical high level, which collectively deselects the four blocks BLOCK0, BLOCK4-BLOCK6.

In the foregoing specification, the invention has been described with reference to specific embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A nonvolatile memory device residing on a substrate, comprising:
   (A) a first block comprising a first memory cell, a first bit line coupled to a drain of the first memory cell, and a first source line coupled to a source of the first memory cell;
   (B) a second block comprising a second memory cell, a second bit line coupled to a drain of the second memory cell, and a second source line coupled to a source of the second memory cell;
   (C) a word line coupled to control gates of the first and second memory cells;
   (D) first source switch means coupled to the first source line for selectively coupling a first potential, a second potential, and a third potential to the first source line, wherein the second potential has a voltage intermediate between the first potential and the third potential;
   (E) second source switch means coupled to the second source line for selectively coupling one of the first, second, and third potentials to the second source line;

(F) block select means for selecting one the first and second source switch means to couple one of the first, second, and third potentials to its respective one of the first and second source lines, wherein the block select means receives a block address for selecting one of the first and second source switch means; and (G) configuration cell means coupled to the block select means for configuring block operations of the first and second blocks, wherein the configuration cell means can be in a first voltage state and a second voltage state, wherein when the configuration cell means is in the first voltage state, the configuration cell means causes the block select means to separately select one of the first and second source switch means depending upon the address received, wherein when the configuration cell means is in the second voltage state, the configuration cell means causes the block select means to collectively select the first and second source switch means.

2. The nonvolatile memory device of claim 1, further comprising a plurality of blocks, each associated with one of a plurality of source switches, wherein the plurality of source switches are coupled to the block select means, wherein the configuration cell means causes the block select means to separately select one of the plurality of source switches depending upon the address received when the configuration cell means is in the first voltage state, wherein the configuration cell means causes the block select means to collectively select a number of the plurality of source switches depending upon the address received when the configuration cell means is in the second voltage state.

3. The nonvolatile memory device of claim 2, wherein the configuration cell means further comprises a plurality of configuration cells, each can be in the first voltage state and the second voltage state.

4. The nonvolatile memory device of claim 1, wherein the first block includes a first sub-block and a second sub-block, wherein the second block includes a third sub-block and a fourth sub-block.

5. The nonvolatile memory device of claim 4, wherein the first source switch means comprises a first source switch coupled to the first sub-block and a second source switch coupled to the second sub-block, wherein the second source switch means comprises a third source switch coupled to the third sub-block and a fourth source switch coupled to the fourth sub-block.

6. The nonvolatile memory device of claim 5, wherein the first sub-block of the first block is grouped together with the third sub-block of the second block on the substrate and the second sub-block of the first block is grouped together with the fourth sub-block of the second block on the substrate.

7. The nonvolatile memory device of claim 1, wherein the nonvolatile memory device is an electrically programmable and electrically erasable read only memory device.

8. The nonvolatile memory device of claim 1, wherein the configuration cell means comprises a content addressable memory cell.

9. The nonvolatile memory device of claim 1, wherein the configuration cell means can be electrically erased and programmed to reconfigure the block operations of the first and second blocks.

10. The nonvolatile memory device of claim 1, further comprising means for disabling the configuration cell means to configure the block operation of the first and second blocks during a read operation and a programming operation.

11. A nonvolatile memory device residing on a substrate, comprising:

(A) a first block that comprises
 (a) a first sub-block associated with a first data pin of the memory device, comprising
  (1) a first memory cell;
  (2) a first bit line coupled to a drain of the first memory cell;
  (3) a first source line coupled to a source of the first memory cell;
 (b) a second sub-block associated with a second data pin of the memory device, comprises
  (1) a second memory cell;
  (2) a second bit line coupled to a drain of the second memory cell;
  (3) a second source line coupled to a source of the second memory cell;

(B) a second block that comprises
 (a) a third sub-block associated with the first data pin, comprising
  (1) a third memory cell;
  (2) a third bit line coupled to a drain of the third memory cell;
  (3) a third source line coupled to a source of the third memory cell;
 (b) a fourth sub-block associated with the second data pin, comprising
  (1) a fourth memory cell;
  (2) a fourth bit line coupled to a drain of the fourth memory cell;
  (3) a fourth source line coupled to a source of the fourth memory cell, wherein the first sub-block of the first block and the third sub-block of the second block are grouped together on the substrate to form a first data bit group corresponding to the first data pin, wherein the second sub-block of the first block and the fourth sub-block of the second block are grouped together on the substrate to form a second data bit group corresponding to the second data pin;

(C) a word line coupled to control gates of the first, second, third, and fourth memory cells;

(D) first source switch means coupled to the first source line of the first sub-block and to the second source line of the second sub-block for selectively coupling a first potential, a second potential, and a third potential to the first and second source lines, wherein the second potential has a voltage intermediate between the first potential and the third potential;

(E) second source switch means coupled to the third source line of the third sub-block and to the fourth source line of the fourth sub-block for selectively coupling one of the first, second, and third potentials to the third and fourth source lines;

(F) block select means for selecting one of the first and second source switch means to couple one of the first, second, and third potentials to its respective ones of the first, second, third, and fourth source lines, wherein the block select means receives a block address for selecting one of the first and second source switch means; and (G) configuration cell means coupled to the block select means for configuring block operations of the first and second blocks, wherein the configuration cell means can be in a first voltage state and a second voltage state, wherein when the configuration cell means is in the first voltage state, the configuration cell means causes the block select means to separately select one of the first and second source switch means depending upon the address received, wherein when the configuration cell means is in the second voltage state, the configuration cell means causes the block select means to collectively select the first and second source switch means.

12. The nonvolatile memory device of claim 11, wherein the first source switch means comprises a first source switch coupled to the first source line of the first sub-block and a second source switch coupled to the second source line of the second sub-block, wherein the second source switch means comprises a third source switch coupled to the third source line of the third sub-block and a fourth source switch coupled to the fourth source line of the fourth sub-block.

13. The nonvolatile memory device of claim 11, further comprising
   (i) first sensing means coupled to the first and third bit lines of the first data bit group for detecting a first voltage level on a selected one of the first and third bit lines and for applying the detected first voltage level to the first data pin; and
   (ii) second sensing means coupled to the second and fourth bit lines of the second data bit group for detecting a second voltage level on a selected one of the second and fourth bit lines and for applying the detected second voltage level to the second data pin.

14. The nonvolatile memory device of claim 11, further comprising a plurality of data bit groups, each being associated with one of a plurality of data pins of the memory device, and a plurality of blocks, each having a plurality of sub-blocks and each associated with one of a plurality of source switch means, wherein each of the plurality of data bit groups includes one of the plurality of sub-blocks of each of the plurality of blocks, wherein the plurality of source switch means are coupled to the block select means, wherein the configuration cell means causes the block select means to separately select one of the plurality of source switch means depending upon the address received when the configuration cell means is in the first voltage state, wherein the configuration cell means causes the block select means to collectively select a number of the plurality of source switch means depending upon the address received when the configuration cell means is in the second voltage state.

15. The nonvolatile memory device of claim 14, wherein the configuration cell means further comprises a plurality of configuration cells, each can be in the first voltage state and the second voltage state.

16. The nonvolatile memory device of claim 14, wherein each of the plurality of source switch circuits further comprises a plurality of source switches, each associated with one of the plurality of sub-blocks of each of the plurality of blocks.

17. The nonvolatile memory device of claim 11, wherein the configuration cell means comprises a content addressable memory cell.

18. The nonvolatile memory device of claim 11, wherein the nonvolatile memory device is an electrically programmable and electrically erasable read only memory device.

19. The nonvolatile memory device of claim 11, wherein the configuration cell means can be electrically erased and programmed to reconfigure the block operations of the first and second blocks.

20. The nonvolatile memory device of claim 11, further comprising means for disabling the configuration cell means to configure the block operations of the first and second blocks during a read operation and a programming operation.

* * * * *